(12) United States Patent
Cheng et al.

(10) Patent No.: US 10,784,363 B2
(45) Date of Patent: Sep. 22, 2020

(54) METHOD AND STRUCTURE OF FORMING FINFET CONTACT

(71) Applicant: International Business Machines Corporation, Armonk, NY (US)

(72) Inventors: Kangguo Cheng, Schenectady, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/424,904

(22) Filed: May 29, 2019

(65) Prior Publication Data
US 2019/0296129 A1   Sep. 26, 2019

Related U.S. Application Data

(62) Division of application No. 15/865,383, filed on Jan. 9, 2018, now Pat. No. 10,347,744.

(51) Int. Cl.
| | |
|---|---|
| *H01L 29/66* | (2006.01) |
| *H01L 29/417* | (2006.01) |
| *H01L 27/12* | (2006.01) |
| *H01L 29/06* | (2006.01) |
| *H01L 29/78* | (2006.01) |

(Continued)

(52) U.S. Cl.
CPC .. *H01L 29/66598* (2013.01); *H01L 21/02252* (2013.01); *H01L 21/26506* (2013.01); *H01L 21/76897* (2013.01); *H01L 27/1211* (2013.01); *H01L 29/0673* (2013.01); *H01L 29/41791* (2013.01); *H01L 29/6656* (2013.01); *H01L 29/66553* (2013.01); *H01L 29/66795* (2013.01);

(Continued)

(58) Field of Classification Search
CPC . H01L 29/785–7856; H01L 2029/7858; H01L 21/76897; H01L 29/41725; H01L 29/41783; H01L 29/41791; H01L 29/66795; H01L 29/6659–66598
See application file for complete search history.

(56) References Cited

U.S. PATENT DOCUMENTS

| | | |
|---|---|---|
| 5,480,838 A | 1/1996 | Mitsui |
| 6,501,108 B1 | 12/2002 | Suzuki et al. |
| (Continued) | | |

OTHER PUBLICATIONS

List of IBM Patents or Patent Applications Treated as Related.

*Primary Examiner* — Sonya McCall-Shepard
(74) *Attorney, Agent, or Firm* — Fleit Intellectual Property Law; Jose Gutman

(57) ABSTRACT

Various methods and structures for fabricating a contact for a semiconductor FET or FinFET device. A semiconductor FET structure includes a substrate, a source/drain region layer and source/drain contact. First and second gate spacers are adjacent respective first and second opposing sides of the source/drain contact. The source/drain contact is disposed directly on and contacting the entire source/drain region layer, and at a vertical level thereabove, the source/drain contact being recessed to a limited horizontal area continuing vertically upwards from the vertical level. The limited horizontal area horizontally extending along less than a full horizontal length of a vertical sidewall of the first and second gate spacers, and less than fully covering the source/drain region layer. A method uses a reverse contact mask to form a shape of the source/drain contact into an inverted "T" shape.

18 Claims, 9 Drawing Sheets

(51) Int. Cl.
*H01L 21/768* (2006.01)
*H01L 21/265* (2006.01)
*H01L 21/02* (2006.01)

(52) U.S. Cl.
CPC *H01L 29/66818* (2013.01); *H01L 2029/7858* (2013.01)

(56) References Cited

U.S. PATENT DOCUMENTS

| | | |
|---|---|---|
| 6,756,644 B2 | 6/2004 | Stout |
| 7,569,897 B2 | 8/2009 | Anderson et al. |
| 7,843,016 B2 | 11/2010 | Anderson et al. |
| 8,362,568 B2 | 1/2013 | Lin et al. |
| 8,362,572 B2 | 1/2013 | Huang et al. |
| 8,415,751 B2 | 4/2013 | Mukherjee et al. |
| 8,471,343 B2 | 5/2013 | Doris et al. |
| 2008/0265343 A1 | 10/2008 | Greene et al. |
| 2013/0095629 A1 | 4/2013 | Ando et al. |
| 2014/0061734 A1 | 3/2014 | Basker et al. |
| 2014/0183605 A1 | 7/2014 | Mochizuki et al. |
| 2014/0217517 A1 | 8/2014 | Cai et al. |
| 2014/0284667 A1 | 9/2014 | Basker et al. |
| 2015/0235897 A1* | 8/2015 | Fu .................. H01L 21/76879 438/299 |
| 2016/0218206 A1 | 7/2016 | Leobandung |

* cited by examiner

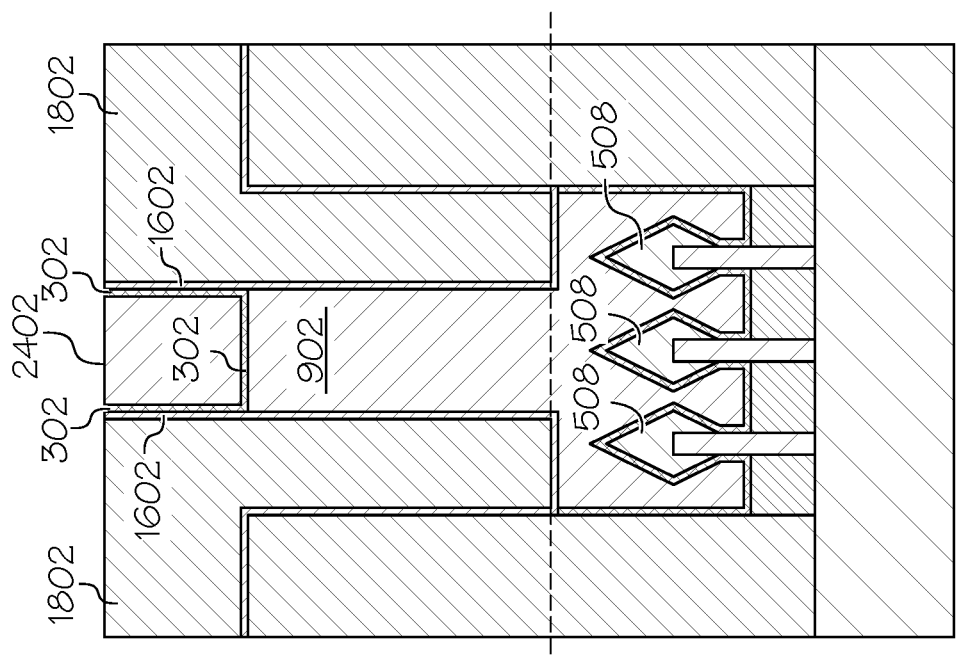
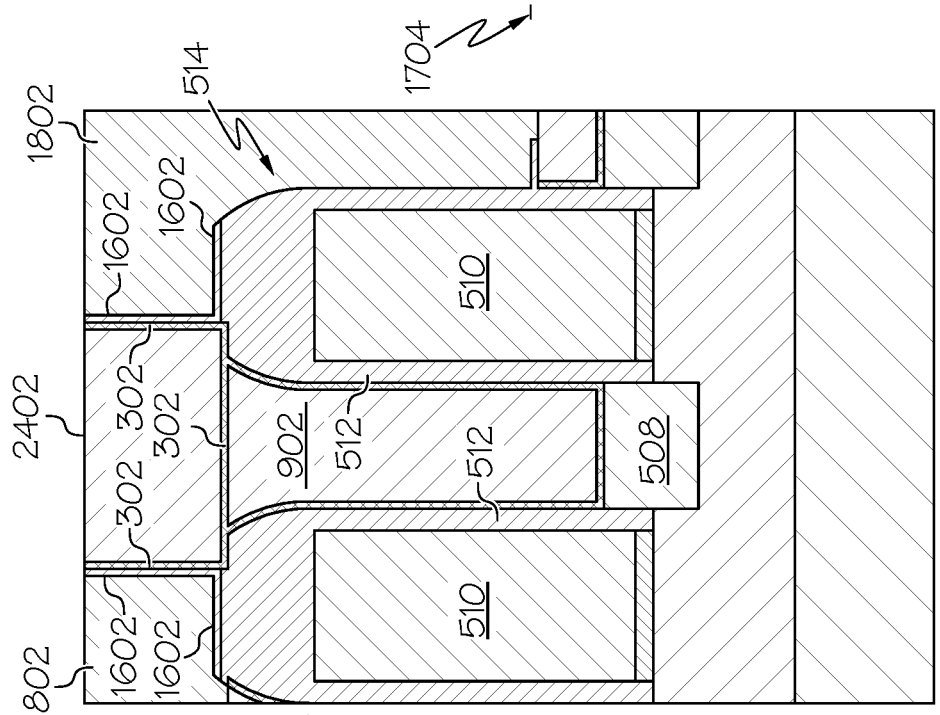
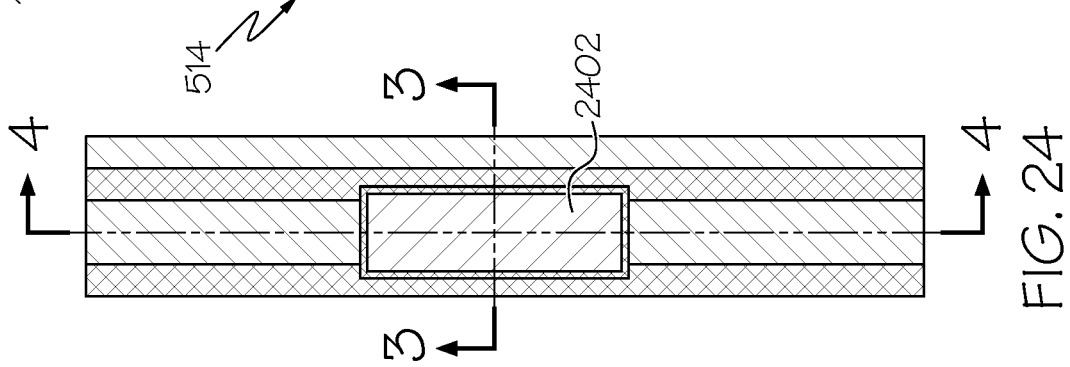

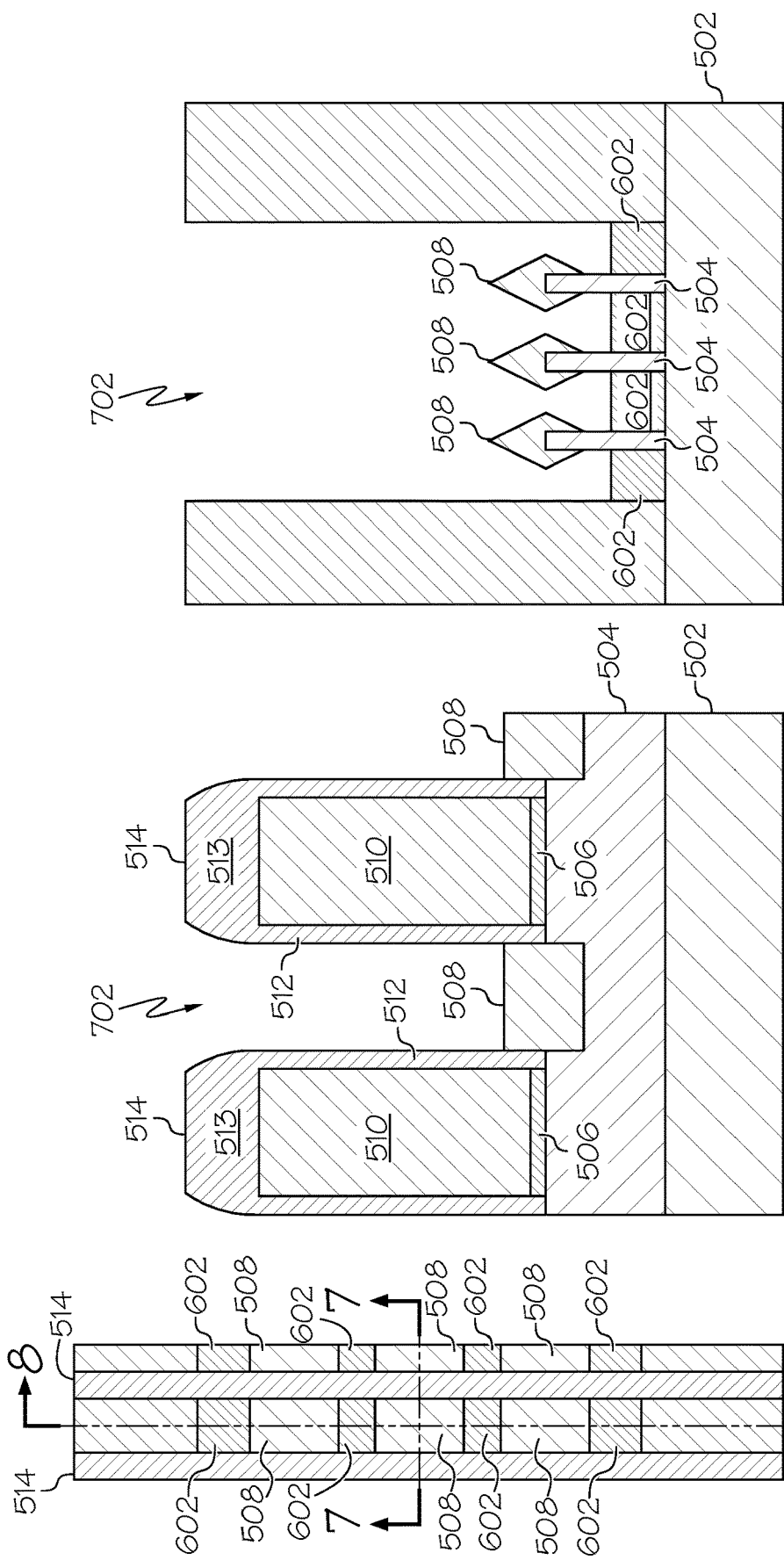

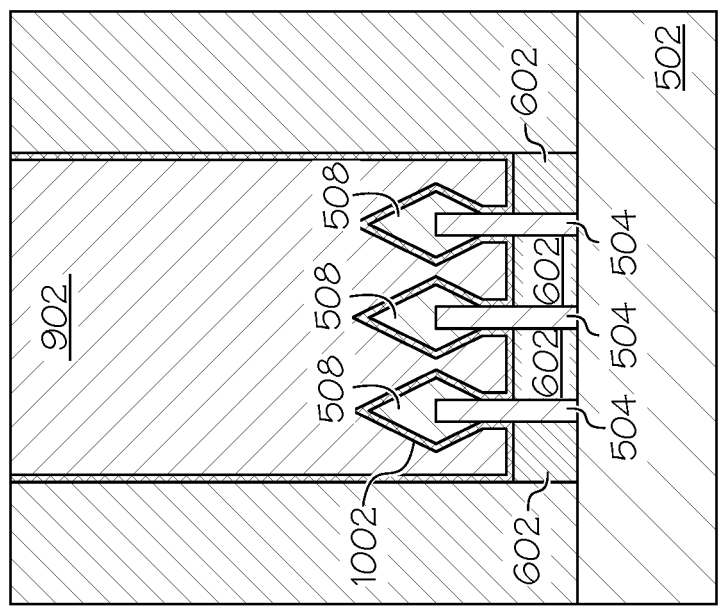
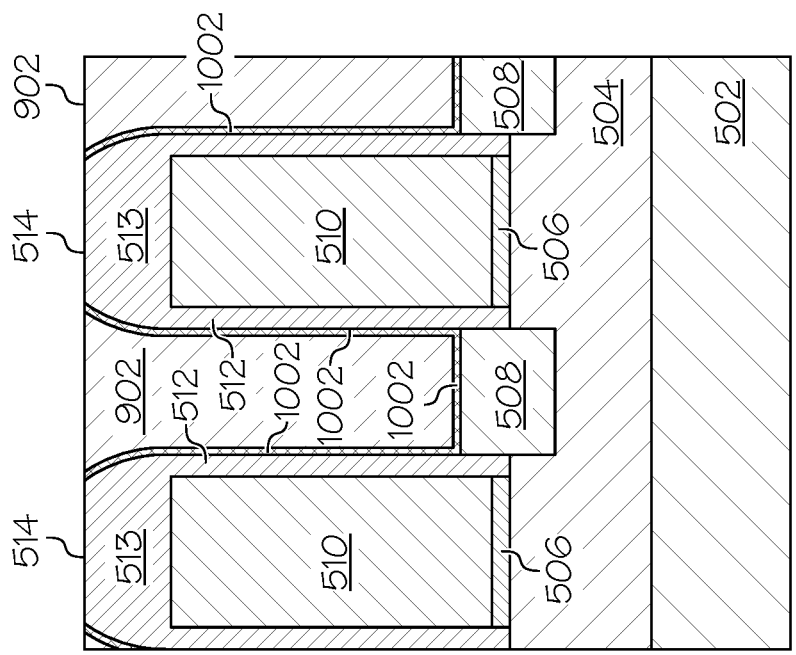
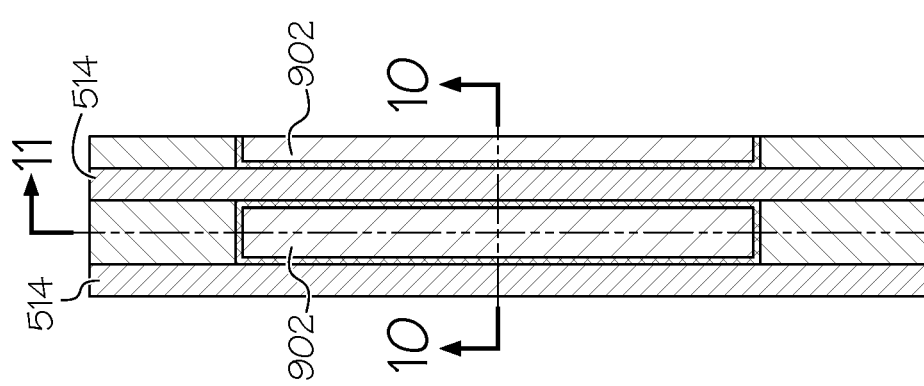

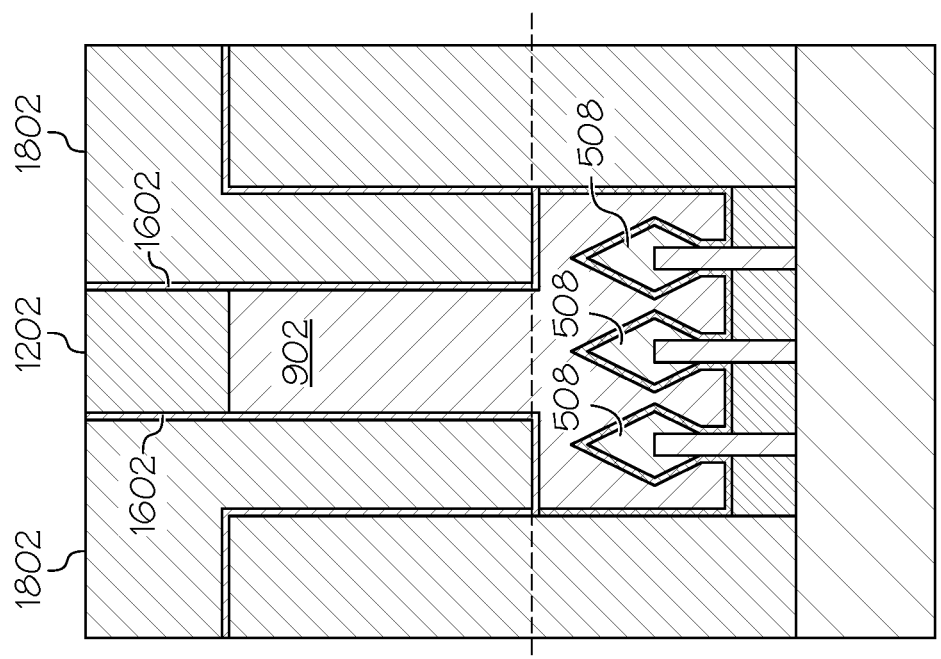
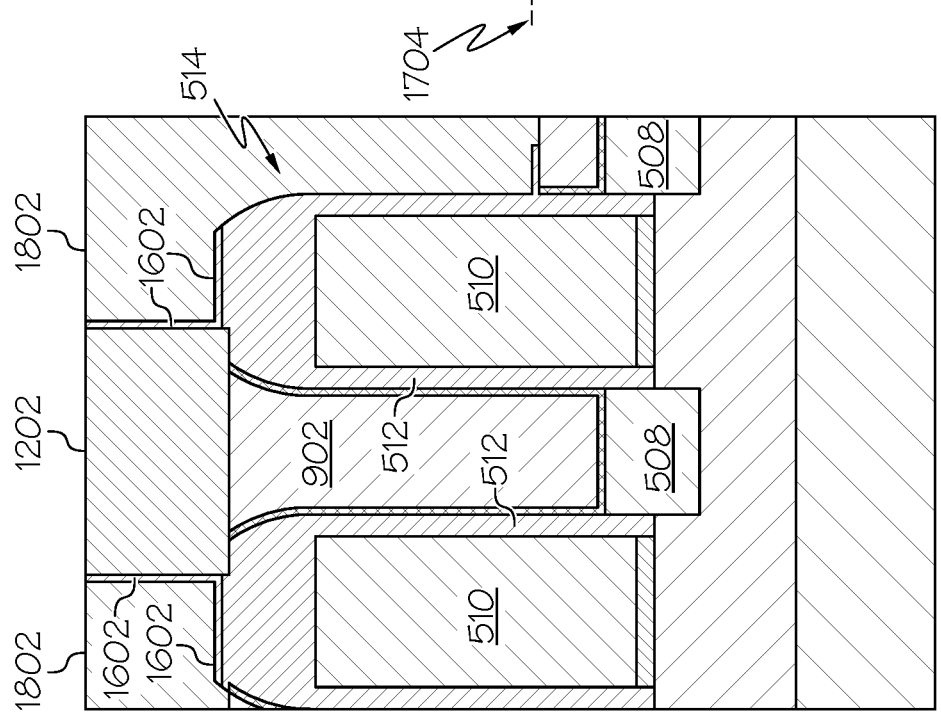
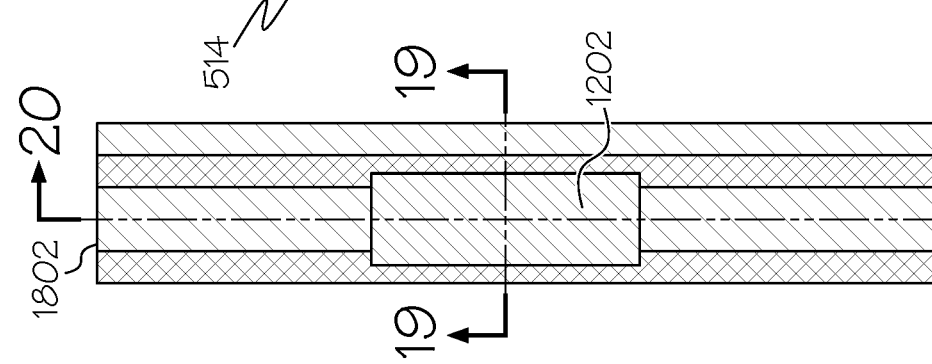

METHOD AND STRUCTURE OF FORMING FINFET CONTACT

BACKGROUND OF THE INVENTION

The present invention generally relates to the field of semiconductors, and more particularly relates to a method of fabricating FET semiconductor devices.

Self-aligning contacts (SAC) are typically used in semiconductor fabrication technology for CMOS (complementary metal-oxide-semiconductor) technology below 14 nm nodes, due to limited available space for placing transistor source/drain contacts. To place transistors as close as possible to each other, a source/drain contact of an FET transistor, for example, is merged with a source/drain contact of another adjacent FET transistor, thereby minimizing the distance between the two transistors on a substrate. However, the merged source/drain contact will be located very close to an adjacent gate of each of the two adjacent transistors. A thin spacer insulating material may be the only structure that separates the conductive source/drain contact and gate. This semiconductor structure, i.e., the source/drain contact and the gate separated by a thin insulating spacer creates a capacitor. This is an unintended capacitor with parasitic capacitance that increases power consumption and slows down the speed of a semiconductor circuit. The increased parasitic capacitance is undesirable for most circuit designs.

SUMMARY OF THE INVENTION

Various embodiments of the present invention include fabrication of a semiconductor FET structure having a merged source/drain contact that is a shared node of a plurality of FETs, and which the merged source/drain contact is formed in an inverted "T" shape that reduces parasitic capacitance.

According to one example, a method for fabricating an FET semiconductor structure comprises: forming, on a substrate, at least one source/drain region of at least one FET, the at least one source/drain region being formed adjacent to a gate stack region of the at least one FET. The method then performs depositing conductive contact material directly on and fully covering the at least one source/drain region to form a source/drain contact for the at least one source/drain region, the source/drain contact being disposed adjacent to, and contacting, a vertical sidewall of a gate spacer of a gate stack in the gate stack region; forming a reverse contact mask directly on and covering the source/drain contact, the reverse contact mask covering a limited horizontal area over the source/drain contact that is disposed directly over the at least one source/drain region, the limited horizontal area contacting, and horizontally extending along, less than a full horizontal length of the vertical sidewall of the gate spacer of the gate stack, the limited horizontal area less than fully covering the source/drain contact disposed directly over the at least one source/drain region; etching the source/drain contact to create recesses in the source/drain contact where there is no reverse contact mask covering the source/drain contact; and depositing dielectric material directly on, and filling therewith, the recesses.

According to another example, a semiconductor FET structure comprises: a substrate; a source/drain region layer of a plurality of FETs being disposed on the substrate and being adjacent to first gate stack region and second gate stack region of two respective FETs in the plurality of FETs, a source/drain contact being disposed directly on the source/drain region layer, the first gate stack region and second gate stack region including a respective first gate stack with a first gate spacer and second gate stack with a second gate spacer, the first gate spacer and the second gate spacer separating and insulating the respective first gate stack and second gate stack from adjacent respective first and second opposing sides of the source/drain contact; and the source/drain contact being disposed directly on, in direct contact with, and extending fully across a first horizontal area of a top interface surface of the source/drain region layer, and a horizontal shape of the source/drain contact continuing a shape of the first horizontal area while extending upwards to a vertical level above and directly on the source/drain region layer, the source/drain contact at the vertical level and continuing vertically upwards from the vertical level to a top surface of the source/drain contact being recessed to a limited horizontal area, the limited horizontal area of the source/drain contact contacting, and horizontally extending along, less than a full horizontal length of a vertical sidewall of each of the first gate spacer and the second gate spacer, the limited horizontal area of the source/drain contact being disposed directly on, but less than fully covering the source/drain region layer. According to various embodiments, the source/drain contact includes conductive material that surrounds and wraps around each of a plurality of separate source/drain epitaxy regions in the source/drain region layer thereby forming a merged node electrically interconnecting the plurality of separate source/drain epitaxy regions.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 3 is a cross-sectional side view of the semiconductor structure of FIG. 24, along the 3-3 line shown in FIG. 24;

FIG. 4 is a cross-sectional side view of the semiconductor structure of FIG. 24, along the 4-4 line shown in FIG. 24;

FIG. 6 is a top view of the semiconductor structure of FIG. 5 in a step of the example process of fabricating semiconductor devices, according to an embodiment of the invention;

FIG. 7 is a cross-sectional side view of the semiconductor structure of FIG. 6, along the 7-7 line shown in FIG. 6;

FIG. 8 is a cross-sectional side view of the semiconductor structure of FIG. 6, along the 8-8 line shown in FIG. 6;

FIG. 9 is a top view of the semiconductor structure of FIG. 5 in a step of the example process of fabricating semiconductor devices, according to an embodiment of the invention;

FIG. 10 is a cross-sectional side view of the semiconductor structure of FIG. 9, along the 10-10 line shown in FIG. 9;

FIG. 11 is a cross-sectional side view of the semiconductor structure of FIG. 9, along the 11-11 line shown in FIG. 9;

FIG. 18 is a top view of the semiconductor structure of FIG. 5 in a step of the example process of fabricating semiconductor devices, according to an embodiment of the invention;

FIG. 19 is a cross-sectional side view of the semiconductor structure of FIG. 18, along the 19-19 line shown in FIG. 18;

FIG. 20 is a cross-sectional side view of the semiconductor structure of FIG. 18, along the 20-20 line shown in FIG. 18;

FIG. 24 is a top view of the semiconductor structure of FIG. 5 in a step of the example process of fabricating semiconductor devices, according to an embodiment of the invention.

DETAILED DESCRIPTION

Figure 2:
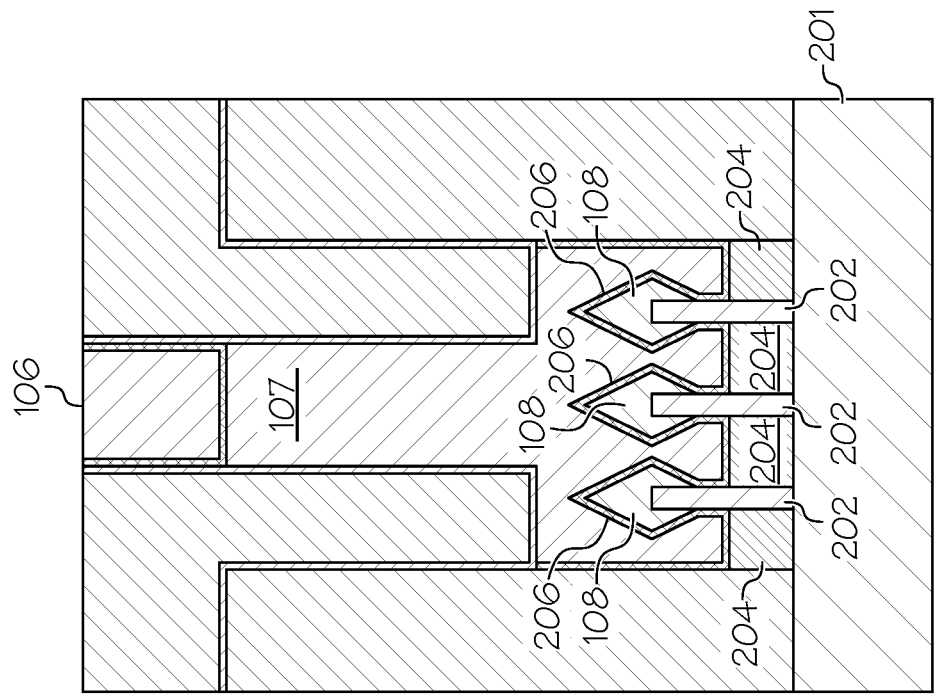
FIG. 2 is a cross-sectional side view of the example semiconductor structure of FIG. 1, along the 2-2 line shown in FIG. 1.

It is to be understood that the present invention will be described in terms of various illustrative example processes for fabricating FET semiconductor structures on a circuit supporting substrate. These fabrication processes may be used to fabricate planar FET semiconductor devices, FinFET semiconductor devices, or both types of semiconductor devices, on a circuit supporting substrate. However, other semiconductor architectures, structures, substrate materials, and process features and steps may be varied within the scope of the present invention. Various embodiments of the present invention include, for example, both SiGe fins and Si fins on the same wafer. Such semiconductor structure, for example, can provide CMOS devices in an integrated circuit.

It will also be understood that when an element such as a layer, region, area, or substrate is referred to as being "on" or "over" another element, it can be directly on the other element or intervening elements may also be present. In contrast, when an element such as a layer, region, area, or substrate is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth, described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 1:
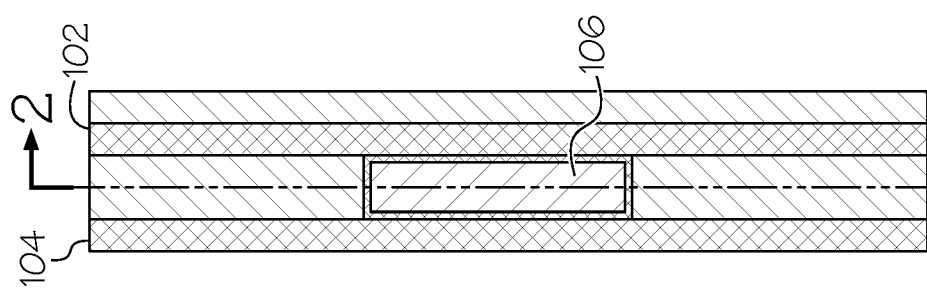
FIG. 1 is a top view of an example semiconductor structure, according to an embodiment of the invention.

Referring now to the drawings, in which like numerals represent the same or similar elements, FIG. 1 shows a top view of an example semiconductor structure, according to an embodiment of the invention, while FIG. 2 shows a cross-sectional side view of the semiconductor structure of FIG. 1, along the 2-2 line shown in FIG. 1. These two figures illustrate a first transistor gate with spacer 102 (which may also be referred to as a "gate") and a second transistor gate with spacer 104 (gate) formed adjacent to respective two opposing sides of a source/drain contact 106 of an FET (field effect transistor). It should be noted that while this example shows the two gates 102, 104 formed adjacent to two opposing sides of the source/drain contact 106, 107, of an FET, other arrangements of gates 102, 104 relative to a source/drain contact 106 are anticipated within the scope of the present invention. For example, the gates 102, 104 do not necessarily have to be adjacent to opposing sides of the source/drain contact 106 of an FET. The source/drain contact 106, 107, according to certain embodiments, comprises a source/drain epitaxy region layer 108 (which may also be referred to as "epitaxially grown source/drain region", "source/drain epitaxy region", "source/drain contact region", "source/drain active region", "source/drain region layer", "epitaxy region", "epi region", or "source/drain region", or the like) and a merged source/drain contact 106, 107, of two adjacent FETs. This forms a shared node of the two FET transistors, which can in various examples be a shared node of a plurality of FETs and optionally also be a shared node of a plurality of FinFETs. The source/drain epitaxy region layer 108 and the merged source/drain contact 106, 107 are closely spaced to each of the two adjacent transistor gates with respective spacers 102, 104. Parasitic capacitance will exist, according to the example, between each of the two opposing sides of the merged source/drain contact 106, 107, and the respective each adjacent transistor gate with respective spacer 102, 104.

The source/drain contact 107 can be formed directly on a top interface surface of a source/drain epitaxy region layer 108 of an FET. In various embodiments, an interfacial conductive liner film 206 (which may be also referred to as "conductive liner film", "conductive liner", "conductive film", or the like) is interposed between the top interface surface of the source/drain epitaxy region layer 108 and the conductive contact of the source/drain contact 107. Example materials of this conductive liner 202 include, but are not limited to, titanium (Ti), nickel (Ni), or nickel platinum (NiPt).

The source/drain epi region layer 108 is typically located adjacent to the channel of the transistor. The source/drain contact 107 typically is disposed directly over, and extends vertically upwards from, the top interface surface of the source/drain region layer 108 to provide a conductive contact of a source/drain contact 106, 107 of a transistor. In the case of a source/drain region layer 108 of a plurality of FETs, the source/drain contact 106, 107, provides a conductive contact of a merged source/drain contact 106, 107, of the plurality of FETs. The source/drain region layer 108 can be considered a node for the plurality of FETs in a semiconductor electronic circuit.

According to various example fabrication processes, the source/drain region layer 108 can be formed as a single individual source/drain region layer 108 (e.g., of a planar FET). The source/drain region layer 108, according to various embodiments, can be formed as one or more source/drain regions 108 of one or more FinFETs, that collectively constitute the source/drain region layer 108 of the one or more FinFETs such as shown in FIG. 2.

FIG. 2 illustrates an example where the source/drain contact 107 is in direct contact with, and surrounding or wrapped around, three individual source/drain regions 108 of three FinFETs. By optionally forming the source/drain contact 107 surrounding or wrapped around a source/drain epi region 108 it increases the amount of interface surface between the source/drain contact 107 and the epi region 108, which normally reduces the resistance of the source/drain contact.

Each individual epi region 108 may be part of a fin structure of a FinFET device. The three fins 202 shown in FIG. 2 have dielectric material 204 interposed between them. The dielectric material 204 can be any suitable dielectric material, including but not limited to, oxide, nitride, oxynitride, SiBCN, SiOCN, SiOC, or the like, or any suitable combination of these materials. The dielectric material 204 is formed around each fin 202, according to a fabrication process, as shallow trench isolation (STI) material. While the current example is illustrated with three source/drain epitaxy regions 108 and three fins 204 of one or more FinFETs, a single epi region 108 of a planar FET could alternatively be used in another example within the scope of the present disclosure. To simplify the discussion of the example, whether a single epitaxy region is used or a plurality of epi regions and associated fins are used, the structure may be generally referred to herein as the epi region 108 of a source/drain contact 106, 107, of a transistor.

According to the example semiconductor structure of FIGS. 1 and 2, the conductive contact 107 of the source/drain contact 106, 107, is formed directly over, in direct contact with, and extends fully across, a first horizontal area of a top interface surface of the source/drain region layer 108. The source/drain contact 106, 107, also extends vertically upwards from the top interface surface of the source/drain region layer 108 to provide at a top surface of the source/drain contact 106/107 a conductive contact of a source/drain of an FET.

The conductive contact 107 of the source/drain contact 106, 107 at the top interface surface of the source/drain region layer 108 extends fully across the first horizontal area of the top interface surface of the source/drain region layer 108. The first horizontal area, according to the example, horizontally extends for a full horizontal length of a vertical sidewall of each of the first gate with spacer 102 and the second gate with spacer 104. These vertical sidewalls of the first gate with spacer 102 and the second gate with spacer 104, according to the present example, are adjacent to respective two opposing sides of the source/drain contact 106, 107.

Figure 17:
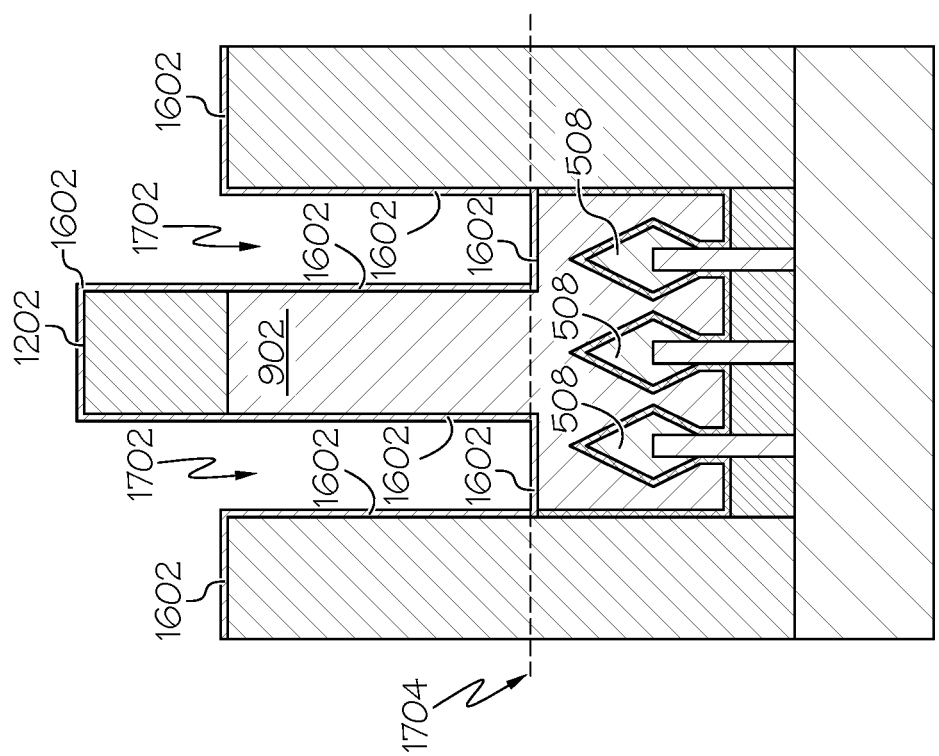
FIG. 17 is a cross-sectional side view of the semiconductor structure of FIG. 15, along the 17-17 line shown in FIG. 15.

As the source/drain contact 106, 107, extends vertically upwards from the source/drain region layer 108 the source/drain contact 106, 107, continues a horizontal shape of the first horizontal area and extending fully across the first horizontal area. The horizontal shape of the source/drain contact 106, 107, continues to be the horizontal shape of the first horizontal area while extending directly upwards to a vertical level above and directly over the source/drain region layer 108. FIG. 17 shows an example of such a vertical level 1704, as will be discussed more fully below. The first horizontal area, according to various embodiments, extends to a full horizontal length of a vertical sidewall of each of the first gate with spacer 102 and the second gate with spacer 104.

However, starting at the vertical level above and directly over the source/drain region layer 108, and continuing vertically upwards therefrom, the source/drain contact 106, 107, is recessed inward to extend fully only in a limited horizontal area. The overall size (e.g., defined by the horizontal X-Y dimensions) of the limited horizontal area of the source/drain contact 106, 107, is smaller than the overall size (e.g., defined by the horizontal X-Y dimensions) of the first horizontal area. The limited horizontal area of the source/drain contact 106,107 contacts, and horizontally extends along, less than a full horizontal length of a vertical sidewall of each of the first gate with spacer 102 and the second gate with spacer 102. The limited horizontal area of the source/drain contact 106, 107 is disposed directly over, but less than fully covering the source/drain region layer 108. The shape of the source/drain contact 106, 107 is an inverted "T" shape, i.e., wider near the bottom of the source/drain contact 106, 107, adjacent to the interface surface of the source/drain region layer 108, and above the vertical level narrower. An example of this inverted "T" shape of the source/drain contact 106, 107 is shown in FIG. 2. Another example of the inverted "T" shape of a source/drain contact is shown in FIG. 17, where the vertical level 1704 is also shown.

The recesses (also referred to as recess regions) in the source/drain contact 106, 107, starting at the vertical level and continuing vertically upwards therefrom reduces the overlap of the source/drain contact 106, 107, that horizontally extends fully along and contacts the vertical sidewall of the first gate with spacer 102 and the vertical sidewall of the second gate with spacer 104. The recess regions of the inverted "T" shape (i.e., where the source/drain contact 106, 107 has been recessed inwards), according to various embodiments are filled with dielectric material that is an electrical insulator (also referred to as insulator material). The insulator material may comprise a dielectric material, such as oxide, nitride, oxynitride, SiBCN, SiOCN, SiOC, or the like, or any suitable combination of these materials.

By reducing the overlap of the source/drain contact 106, 107, that horizontally extends fully along, and contacting, the first gate with spacer 102 and the second gate with spacer 104, it effectively reduces the parasitic capacitance between each of the two opposing sides of the source/drain contact 106, 107 and the respective each adjacent gate with spacer 102, 104.

The inventors have found that the parasitic capacitance is remarkably reduced by use of this inverted "T" shape for the source/drain contact 106, 107, as more clearly shown in FIG. 2. Moreover, any increase in resistance of the source/drain contact 106, 107, created by the inverted "T" shape, is relatively negligible in comparison to the overall resistance of the semiconductor circuit that includes the source/drain contact 106, 107.

Example Fabrication Process

With reference to FIGS. 3 to 24, an example process of fabricating source/drain contacts for a semiconductor structure, such as for a FinFET semiconductor device, will be discussed below. The process begins with a substrate 502 and a channel layer 504 disposed directly on the substrate 502. The substrate 502 can be any suitable material, including but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. III-V compound semiconductors may have a composition defined by the formula $AlX1GaX2InX3AsY1PY2NY3SbY4$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). II-VI compound semiconductors may have a composition $ZnA1CdA2SeB1TeB2$, where A1, A2, B1, and B2 are relative proportions each greater than or equal to zero and $A1+A2+B1+B2=1$ (1 being a total mole quantity).

In addition, multiple layers of the semiconductor materials can be used as the semiconductor material of the substrate 502. In some embodiments, the substrate 502 includes both semiconductor materials and dielectric materials. A semiconductor substrate 502 may also comprise an organic semiconductor or a layered semiconductor such as, for example, Si/SiGe, a silicon-on-insulator, or a SiGe-on-insulator. A portion or entire semiconductor substrate may be amorphous, polycrystalline, or monocrystalline. In addition to the aforementioned types of semiconductor substrates, the semiconductor substrate 502 employed in the present invention may also comprise a hybrid oriented (HOT) semiconductor substrate in which the HOT substrate has surface regions of different crystallographic orientation. The semiconductor substrate 502 may be doped, undoped or contain doped regions and undoped regions therein. The semiconductor substrate 502 may contain regions with strain and regions without strain therein, or contain regions of tensile strain and compressive strain. In some embodiments, the substrate 502 includes other device structures (not shown) such as transistors, isolation structures (such as shallow trench isolations), contacts, conducting wires, etc.

A channel layer 504 is formed in the FET region on the substrate 502. At least one gate 514 (which may also be referred to as a "gate stack region" or a "gate stack") is formed on the channel layer 504. In the present example, two gates 514 are formed on the channel layer 504. Each gate 514, according to the example, is formed on a high-K gate dielectric layer 506 disposed directly on the channel layer 504. Source/drain regions 508 may be formed in the channel layer 504, or on the channel layer 504, according to various embodiments. Source/drain regions 508 are formed adjacent to the gate 514.

In some embodiment, source/drain regions 508 are doped with dopants. For silicon, germanium, or silicon germanium semiconductor material, n-type dopant selected from a group of phosphorus (P), arsenic (As) and antimony (Sb), and a p-type dopant selected from a group of boron (B), boron fluoride (BF2), gallium (Ga), indium (In), and thallium (Tl). Dopants can be incorporated in source/drain region 508 by any suitable doping technique or any suitable combination of doping techniques, including but not limited to, ion implantation, gas phase doping, plasma doping, plasma immersion ion implantation, cluster doping, infusion doping, liquid phase doping, solid phase doping, etc. In some embodiments, each source/drain region 508 comprises epitaxy material. Dopants can be incorporated into the epitaxy source/drain during or after an epitaxy process. Incorporating dopants during epitaxy is referred to as "in-situ" doping.

Each gate 514 includes a gate conductor 510 and gate spacer(s) 512. The gate spacer material (e.g., dielectric material and/or insulator material) 512 separates and electrically insulates the gate 514 from adjacent source/drain contact (not shown in FIG. 5) that will be formed on the source/drain region 508. Each gate 514 may further comprise a dielectric cap 513 on top of the gate conductor 510. The dielectric cap 513 can be used, for example, to protect the gate 514 while forming self-aligned contacts (SAC) in later processing. The gate dielectric cap 513 is sometimes referred to as SAC cap 513. It should be noted that the gate dielectric cap (SAC cap) 513 and the gate spacers 512 are normally two different components of the gate 514 that are typically formed in different process steps, even though the two different components may have the same or different materials.

Figure 5:
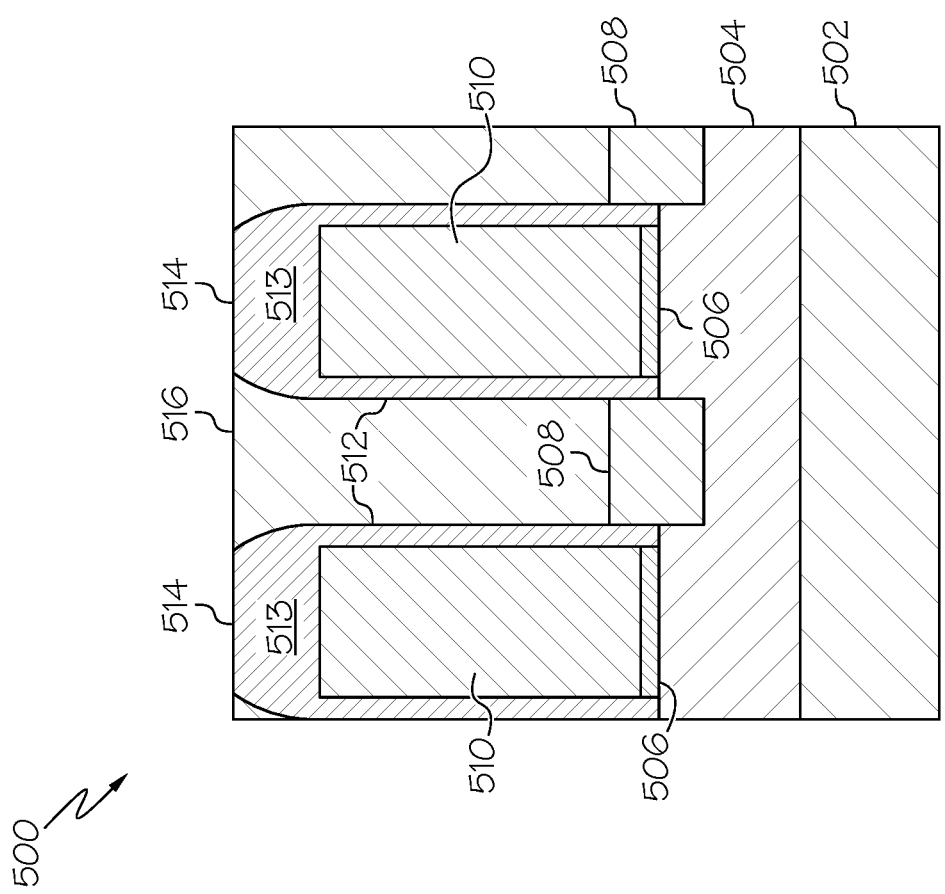
FIG. 5 is a cross-sectional side view of a semiconductor structure in an example process of fabricating semiconductor devices, according to an embodiment of the present invention.

According to the fabrication process, an etched region directly above the source/drain region (where the source/drain contact will be formed on a top interface surface of a source/drain epitaxy region layer 508) is filled with a dielectric material 516 such as oxide. After filling the etched region with the dielectric material 516, the fabrication process continues by a planarization process, as shown in FIG. 5. The planarization process can be done, for example, using chemical and mechanical polishing (CMP). The structure may further comprise other device structures such as trench isolation. Those other structures are not shown in FIG. 5 for clarity.

Gate dielectric material, such as may be used in the gate cap 513 and the gate spacers 512 and other gate structures, can comprise any suitable dielectric material, including but not limited to silicon oxide, silicon nitride, silicon oxynitride, high-k materials, or any combination of these materials. Examples of high-k materials, such as may be used in the gate dielectric layer 506 disposed directly on the channel layer 504 and may be used in other gate structures, include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also understood to be within the scope of the invention.

Gate conductor 510 can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition.

In some embodiments, the gate 514 may further comprise a workfunction setting layer between the gate dielectric 512 and the gate conductor 510. The workfunction setting layer can be a workfunction metal (WFM). WFM can be any suitable material, including but not limited to, a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor 510 and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The fabrication process continues, with additional reference to FIGS. 6, 7, and 8, with a patterning process performed in a source/drain active region 702 of an FET to remove the dielectric material 516 (such as oxide) from the source/drain active region 702 of the FET. The epitaxy layer 508 is on the channel layer 504. Shallow trench isolation (STI) material 602 is formed around each fin 504 as shown in FIGS. 6 and 8. While the current example is illustrated with three source/drain epitaxy regions 508 and three fins 504 of one or more FinFETs, a single epi region 508 of a planar FET could alternatively be used in another example within the scope of the present disclosure. To simplify the discussion of the example, whether a single epitaxy region is used or a plurality of epi regions and associated fins are used, the structure may be generally referred to herein as the epi region 508 of a source/drain contact of at least one transistor.

Shown better in FIGS. 6 and 8, a plurality of semiconductor fins 504 are disposed on the substrate 502. A source/drain epitaxy region layer 508 is epitaxially grown directly on and around each fin 504 as shown in FIG. 8. Alternatively, fin 504 can be recessed before epitaxy. Epitaxy 508 is then grown on top of the remaining fin 504 on the substrate 502. The three fins 504 shown in FIGS. 6 and 8 are surrounded and supported with dielectric material 602 between adjacent fins 504. Dielectric material 602 can be, for example, oxide, nitride, oxynitride, SiBCN, SiOCN, SiOC, or the like, or any suitable combination of these materials. The dielectric material 602 is formed around each fin, according to a fabrication process, as shallow trench isolation (STI) material.

The fabrication process continues, with additional reference to FIGS. 9, 10, and 11. Conductive material (which may also be referred to, without limitation, as "metallization" or "local metallization") 902 is deposited and filled into the trench in source/drain active region 702, were the conductive material covers and surrounds the three fin ends and the source/drain epitaxy region layer 508.

According to the example fabrication process, metallization of the local interconnect at the source/drain contact region 508 is formed by deposition of conductive material. However, there are other ways that conductive contacts may be formed within the scope of the present invention. First, according to the example, there is deposition of a conductive liner film 1002 into the source/drain contact regions 702. Besides covering the epitaxy region 508, the conductive liner film 1002 is also deposited and formed across the vertical sidewalls of the gate spacers 512 in the source/drain contact regions 702. The conductive liner film 1002 can be, for example, made of titanium, nickel platinum, cobalt, and/or titanium nitride. The conductive liner film material can be deposited by any suitable deposition technique, including but not limited to, physical vapor deposition (PVD), atomic layer deposition (ALD), chemical vapor deposition (CVD), etc.

After the deposition of a conductive liner film 1002 into the source/drain contact regions 702, there is deposition of a metallization gap fill 902 with conductive material forming trench contacts to complete the metallization of the interconnects. The metallization gap fill material can be any suitable conductive material, including but not limited to tungsten, cobalt, copper, or tantalum, or a combination thereof. A suitable deposition technique for the metallization gap fill 902 includes but is not limited to CVD, PVD, plating, etc. In some embodiment, the conductive liner film 1002 is omitted from a fabrication process.

In some embodiments, there will be a certain overburden of metallization gap fill material on top of the wafer such as from a CVD deposition. The fabrication process, according to the example, performs a planarization process such as chemical mechanical planarization (CMP) that polishes and removes the excess tungsten metal and removes any conductive liner material 1002, if present, from the top of gates 514. The resulting semiconductor structure, after performing a CMP operation, is shown in FIGS. 9, 10, and 11, including the source/drain contact 902.

Reverse Contact Mask

Figure 14:
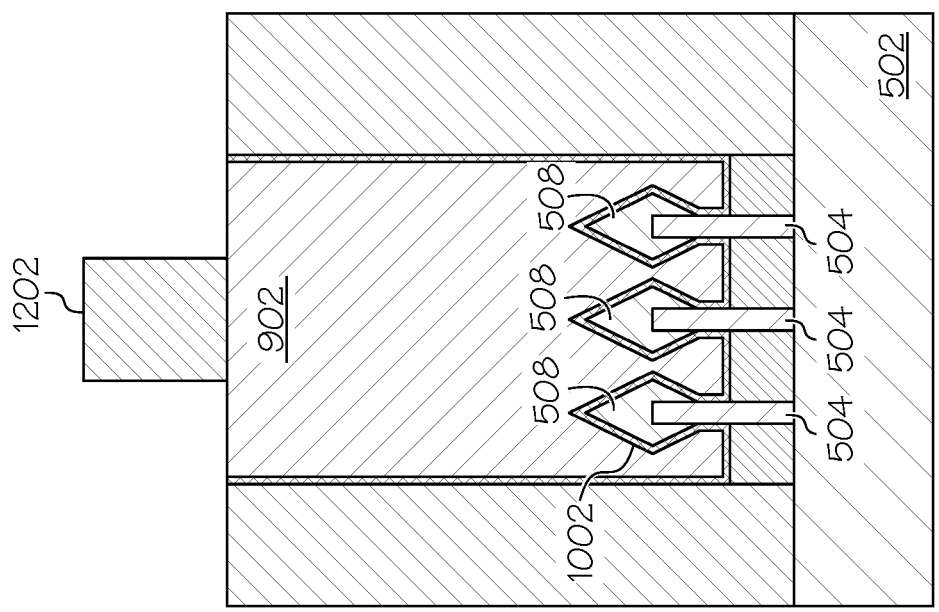
FIG. 14 is a cross-sectional side view of the semiconductor structure of FIG. 12, along the 14-14 line shown in FIG. 12.
Figure 13:
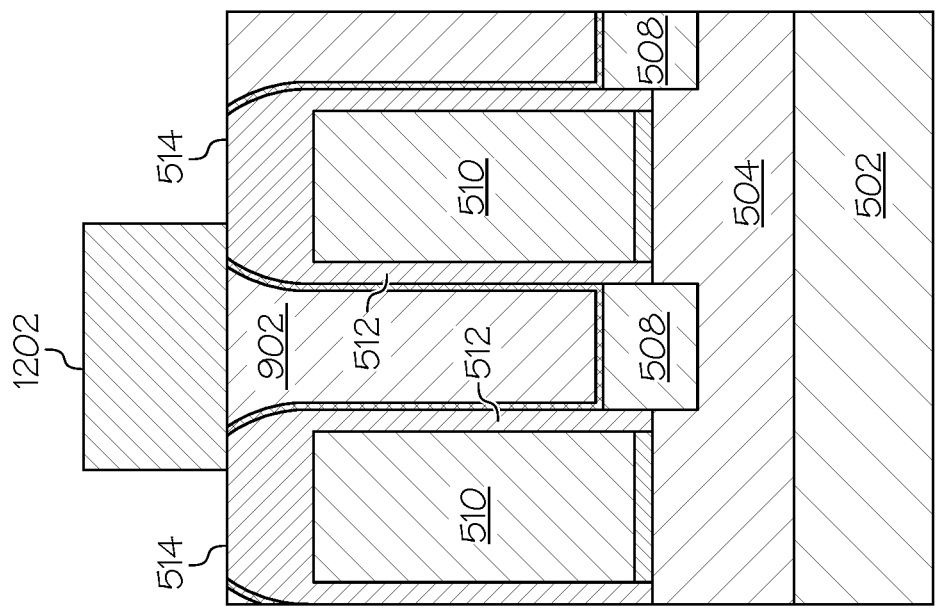
FIG. 13 is a cross-sectional side view of the semiconductor structure of FIG. 12, along the 13-13 line shown in FIG. 12.
Figure 12:
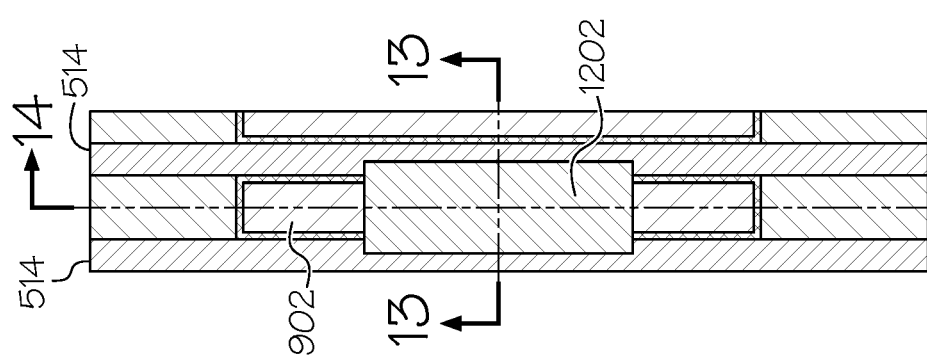
FIG. 12 is a top view of the semiconductor structure of FIG. 5 in a step of the example process of fabricating semiconductor devices, according to an embodiment of the invention.

Continuing with the example fabrication process, with additional reference to FIGS. 12, 13, and 14, a reverse contact mask 1202 is applied to, and disposed directly on, the source/drain contact 902 to pattern the contact metal 902 to form an inverted "T" shape in the contact metal 902, as will be discussed below. According to the example process, the reverse contact mask 1202 comprises sacrificial hardmask material formed (e.g., deposited) on and in contact with the source/drain contact 902. The hardmask material of the reverse contact mask 1202 can comprise any suitable material, including but not limited to amorphous silicon, amorphous carbon, and the like. The sacrificial hardmask material can be deposited by any suitable deposition technique, including but not limited to CVD, PVD, ALD, etc. The sacrificial hardmask layer 1202 can be patterned by any suitable patterning technique, for example using lithography followed by etching, to form a reverse contact mask 1202 as a hardmask layer on the source/drain contact 902.

The reverse contact mask 1202 extends horizontally from the vertical sidewall of the gate spacer 512 of the first gate 514 to the vertical sidewall of the gate spacer 512 of the second gate 514. According to the example, the vertical sidewall of the gate spacer 512 of the first gate 514 and the vertical sidewall of the gate spacer 512 of the second gate 514 are located adjacent to respective two opposing sides of the source/drain contact 902. See FIGS. 12 and 13 showing this placement of the reverse contact mask 1202. As can be seen in FIGS. 12 and 14, the mask 1202 less than fully covers the source/drain contact 902 along a horizontal length of each of the vertical sidewall of the gate spacer 512 of the first gate 514 and the vertical sidewall of the gate spacer 512 of the second gate 514.

The reverse contact mask 1202 fully extends over and covers only a limited horizontal area directly on the top surface of the source/drain contact 902. The reverse contact mask 1202 covers only a limited horizontal area that less than fully covers the source/drain contact 902 disposed directly over the entire first horizontal area of an interface surface of the source/drain epitaxy region layer 508. See FIGS. 12 and 14 showing best this placement of the reverse contact mask 1202. The mask 1202, according to the example, exposes some of the source/drain contact 902 (e.g., along a horizontal length of each of the vertical sidewall of the gate spacer 512 of the first gate 514 and the vertical sidewall of the gate spacer 512 of the second gate 514) to a subsequent metallization patterning/etching operation in a semiconductor fabrication process.

Figure 16:
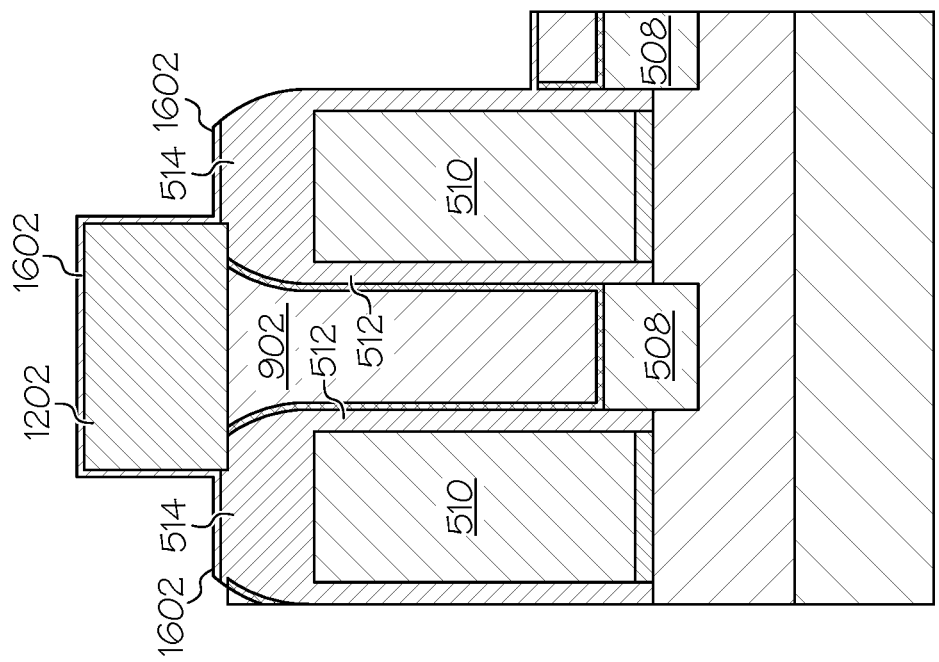
FIG. 16 is a cross-sectional side view of the semiconductor structure of FIG. 15, along the 16-16 line shown in FIG. 15.
Figure 15:
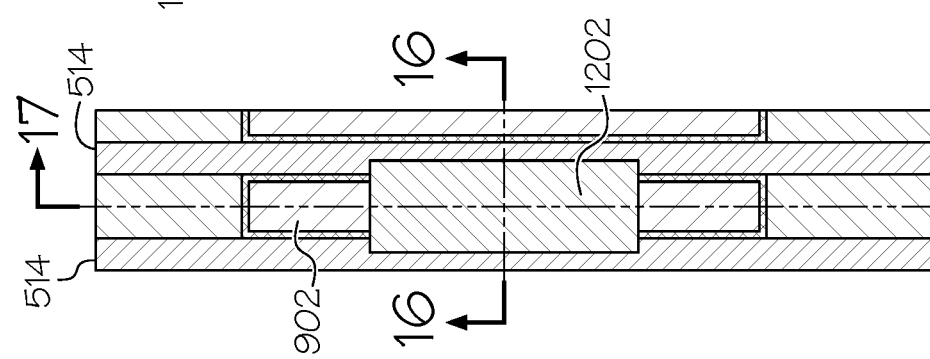
FIG. 15 is a top view of the semiconductor structure of FIG. 5 in a step of the example process of fabricating semiconductor devices, according to an embodiment of the invention.

Continuing with the example fabrication process, with additional reference to FIGS. 15, 16, and 17, a patterning/etching operation creates recesses (which may also be referred to as "recess regions") 1702 in the source/drain contact 902 where there is no reverse contact mask 1202 covering the source/drain contact 902. The patterning/etching operation, according to various embodiments, creates shallow recesses 1702 in the source/drain contact 902. The bottoms of the recesses, according the example, vertically stop in the source/drain contact 902 directly above, while not vertically reaching, the source/drain epitaxy region layer 508. Metallization of the source/drain contact 902 remains covering (and optionally also surrounding) the entire source/drain epitaxy region 508. In certain embodiments, the bottoms of the recesses vertically stop just reaching the top interface surface of the source/drain epitaxy region layer 508.

According to the present example, the bottoms of the recesses 1702 vertically stop in the source/drain contact 902 directly above, while not vertically reaching, the top interface surface of the source/drain region 108. Optionally, a dielectric liner 1602 is deposited directly on all exposed surfaces, e.g., that are reachable from above the semiconductor structure 500, after having etched the recesses 1702. The dielectric liner 1602 is made of dielectric material.

The patterning/etching operation etches recesses 1702 in the source/drain contact 902 to form the shape of the source/drain contact 902 into an inverted "T" shape. See FIGS. 15 and 17 showing best this inverted "T" shape feature of the etched/patterned source/drain contact 902. The etched/patterned recesses 1702 in the source/drain contact 902, according to the example, reduce the amount of the source/drain contact 902 that is creating parasitic capacitance between each of the two opposing sides of the source/drain contact 902 and the respective each adjacent gate with spacer 514, 514. The inventors have found that the parasitic capacitance is remarkably reduced by use of this inverted "T" shape for the source/drain contact 902. Moreover, any increase in resistance of the source/drain contact 902, resulting from the etched recesses in the source/drain contact 902 to form the inverted "T" shape, is relatively negligible in comparison to the overall resistance of a semiconductor circuit that includes the source/drain contact 902.

Continuing with the example fabrication process, with additional reference to FIGS. 18, 19, and 20, a dielectric insulator material 1802, is deposited on and fills the etched recesses 1702 in the source/drain contact 902. The dielectric insulator material 1802 can be any dielectric fill material (e.g., oxide, nitride, oxynitride, SiBCN, SiOCN, SiOC, or the like, or any suitable combination of these materials). The dielectric insulator material 1802, according to the example, fills up the etched recesses 1702 and continues filling vertically upwards to the top surface region of the reverse contact mask 1202. After filling the etched recesses 1702 in the source/drain contact 902, the fabrication process continues by a planarization process, as shown in FIGS. 18, 19, and 20. The planarization process can be done, for example, using chemical and mechanical polishing (CMP). In some embodiments, the dielectric insulator material 1802 may comprise a dielectric liner such a silicon nitride liner 1602 (which is also the dielectric liner 1602 shown in FIGS. 16 and 17). After depositing the dielectric liner 1602, according to these embodiments, this is followed by an oxide fill 1802. Oxide is just an example of dielectric fill material. The dielectric insulator 1802 can be deposited by any suitable technique, including but not limited to CVD, ALD, spin-on-coating, etc.

Figure 23:
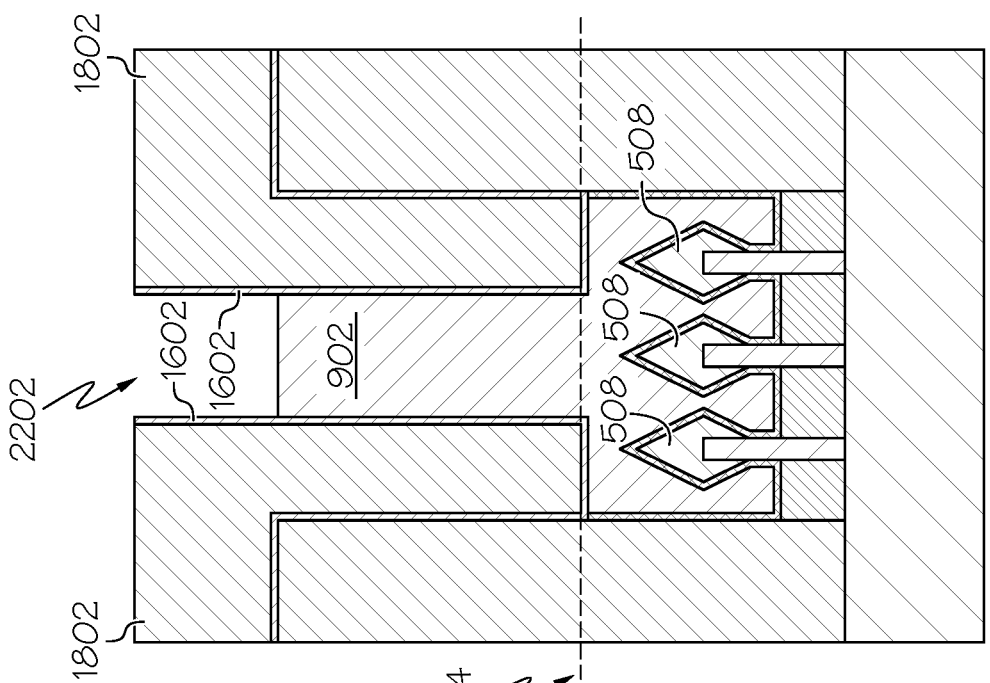
FIG. 23 is a cross-sectional side view of the semiconductor structure of FIG. 21, along the 23-23 line shown in FIG. 21.
Figure 22:
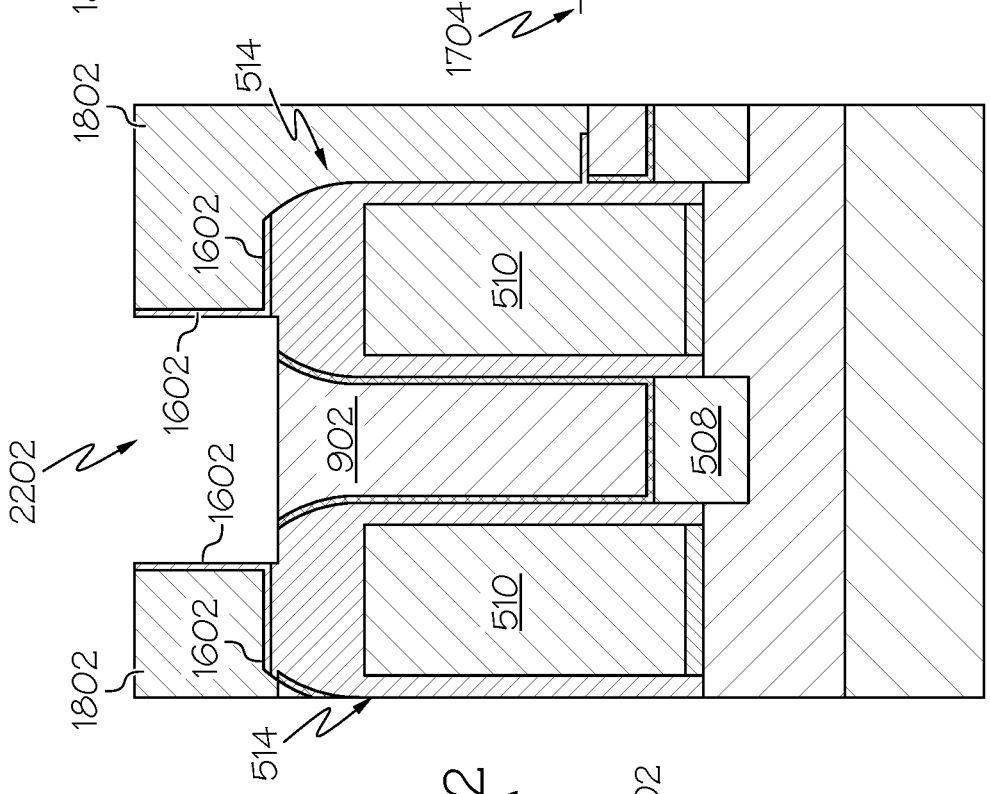
FIG. 22 is a cross-sectional side view of the semiconductor structure of FIG. 21, along the 22-22 line shown in FIG. 21.
Figure 21:
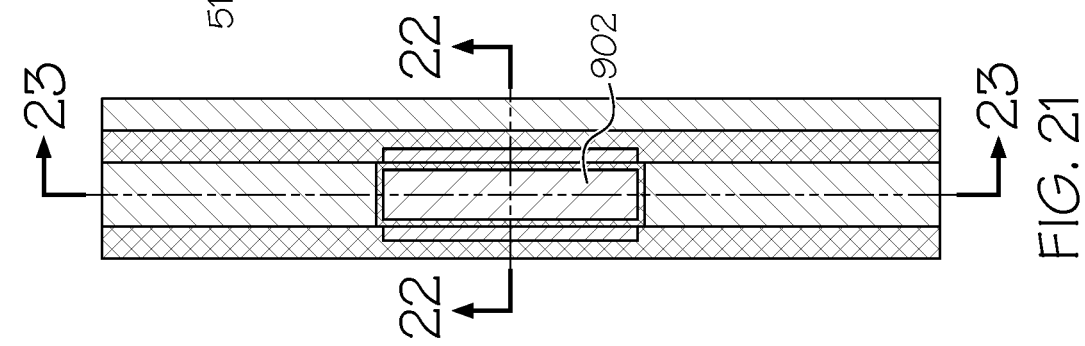
FIG. 21 is a top view of the semiconductor structure of FIG. 5 in a step of the example process of fabricating semiconductor devices, according to an embodiment of the invention.

Continuing with the example fabrication process, with additional reference to FIGS. 21, 22, and 23, the reverse contact mask 1202 is stripped from above the source/drain contact 902 thereby leaving trenches 2202 over the source/drain contact 902. In some embodiments, the reverse contact mask 1202 comprises amorphous silicon which can be removed by any suitable silicon etching process, including but not limited to, a wet etch process (e.g., ammonia etch), dry etch (e.g., a plasma etch containing SF6). In some embodiments, the reverse contact mask 1202 comprises amorphous carbon which can be removed by any suitable carbon etching process, including but not limited to, a wet etch process (e.g., a mixture of sulfuric acid and hydrogen peroxide) or a dry etch (e.g., oxygen plasma etch).

Continuing with the example fabrication process, with additional reference to FIGS. 24, 3, and 4, these trenches 2202 are then filled with conductive material 2402 that provides metallization of the local interconnect at the source/drain contact regions. First, according to the example, there is deposition of an optional conductive liner film 302 into the trenches 2202. The conductive liner film 302 can be, for example, a titanium nitride film deposited and formed across the vertical walls of the trenches 2202 at the insulator fill material 1802 and at the bottom of the trenches 2202 contacting the source/drain contact 902. The conductive liner film 303 can be, for example, a conformal titanium nitride, tantalum nitride, ruthenium, or any other suitable conductive material. The liner can be deposited by any suitable deposition technique, including but not limited to, PVD, CVD, ALD, sputtering, etc.

After the deposition of a conductive liner film 302 into the trenches 2202, there is a metallization gap deposition and fill with conductive material thereby forming trench conductive contacts 2402 to complete local metallization of interconnects on the source/drain contact 2402, 902. The source/drain contact fill material 2402 can be tungsten, cobalt, nickel, ruthenium, copper, etc. The source/drain contact material 2402 can be deposited by any suitable deposition technique, including but not limited to, PVD, CVD, ALD, sputtering, etc. In some embodiments, the conductive liner film 303 can be omitted.

In some embodiments, there will be a certain overburden of material on top of the wafer from the deposition of the source/drain contact fill material 2402. The fabrication process, according to the example, performs a planarization process, such as a chemical mechanical planarization (CMP), that polishes and removes the excess conductor and removes any liner present on top of the self-aligned contact (SAC) from the top of the wafer. The resulting semiconductor structure, after performing the CMP, is shown in FIGS. 24, 3, and 4.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor FET structure comprising:
   a substrate;
   a source/drain region layer of a plurality of FETs being disposed on the substrate and being adjacent to first gate stack region and second gate stack region of two respective FETs in the plurality of FETs, a source/drain contact being disposed directly on the source/drain region layer, the first gate stack region and second gate stack region including a respective first gate stack with a first gate spacer and second gate stack with a second gate spacer, the first gate spacer and the second gate spacer separating and insulating the respective first gate stack and second gate stack from adjacent respective first and second opposing sides of the source/drain contact;
   the source/drain contact being disposed directly on, in direct contact with, and extending fully across a first horizontal area of a top interface surface of the source/drain region layer, and a horizontal shape of the source/drain contact continuing a shape of the first horizontal area while extending upwards to a vertical level above and directly on the source/drain region layer, the source/drain contact at the vertical level and continuing vertically upwards from the vertical level to a top surface of the source/drain contact being recessed to a limited horizontal area, the limited horizontal area of the source/drain contact contacting, and horizontally extending along, less than a full horizontal length of a vertical sidewall of each of the first gate spacer and the second gate spacer, the limited horizontal area of the source/drain contact being disposed directly on, but less than fully covering the source/drain region layer; and
   wherein a cross-sectional side view of the source/drain contact is in a shape of an inverted "T", with a top of the inverted "T" being disposed directly on, in direct contact with, and extending fully across the first horizontal area of the top interface surface of the source/drain region layer.

2. The semiconductor FET structure of claim 1, wherein the source/drain region layer comprises a shared node for a plurality of FinFET semiconductor devices.

3. The semiconductor FET structure of claim 1, comprising
   a plurality of recessed regions,
   wherein each recessed region in the plurality of recessed regions being located directly over the source/drain region layer,
      defined by the source/drain contact at the vertical level and upwards therefrom to the top surface of the source/drain contact where the source/drain contact is recessed from the first horizontal area to the limited horizontal area and further defined by an adjacent vertical sidewall of at least one of the first gate spacer and the second gate spacer, and
      filled with dielectric material.

4. The semiconductor FET structure of claim 3, wherein the dielectric material comprising oxide fill in the plurality of recessed regions.

5. The semiconductor FET structure of claim 1, wherein the source/drain region layer comprises a plurality of fins.

6. The semiconductor FET structure of claim 1, wherein the source/drain region layer comprises an merged plurality of separate source/drain epitaxy regions.

7. The semiconductor FET structure of claim 6, wherein the source/drain contact comprises conductive material that surrounds and wraps around each of the separate source/drain epitaxy regions thereby forming a merged node electrically interconnecting the plurality of separate source/drain epitaxy regions.

8. The semiconductor FET structure of claim 1, wherein the source/drain contact comprises metal providing a source/drain contact metal in the inverted "T" shape.

9. The semiconductor FET structure of claim 8, wherein the source/drain contact metal comprises tungsten or cobalt.

10. The semiconductor FET structure of claim 1, wherein the source/drain contact comprises tungsten, cobalt, copper, or tantalum, or a combination thereof.

11. The semiconductor FET structure of claim 1, wherein the source/drain contact at the vertical level and continuing vertically upwards from the vertical level to a top surface of the source/drain contact being recessed to the limited horizontal area, each of two opposing sides of the limited horizontal area of the source/drain contact being adjacent to dielectric insulator material separating the respective each of two opposing sides of the source/drain contact from an adjacent vertical sidewall of the respective each of the first gate spacer and the second gate spacer; and wherein each of the two opposing sides of the limited horizontal area of the source/drain contact being adjacent to, and contacting, a dielectric liner, which is adjacent to, and contacting, the dielectric insulator material separating the respective each of two opposing sides of the source/drain contact from the adjacent vertical sidewall of the respective each of the first gate spacer and the second gate spacer.

12. The semiconductor FET structure of claim 11, wherein the dielectric insulator material comprises at least one dielectric material selected from the following set of dielectric materials consisting of: oxide, nitride, oxynitride, SiBCN, SiOCN, SiOC, or any combination thereof.

13. The semiconductor FET structure of claim 11, wherein the dielectric liner comprises silicon nitride.

14. The semiconductor FET structure of claim 1, wherein the substrate comprises at least one material selected from the following set of materials consisting of: silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor, Si/SiGe, a silicon-on-insulator, a SiGe-on-insulator, or a hybrid oriented (HOT) semiconductor substrate, or any combination thereof.

15. The semiconductor FET structure of claim 1, wherein at least one of the first gate spacer or the second gate spacer comprises dielectric material selected from the following set of dielectric material consisting of: silicon oxide, silicon nitride, silicon oxynitride, high-k materials, metal oxides, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof.

16. The semiconductor FET structure of claim 1, wherein each of the first gate stack and the second gate stack includes a gate conductor, the gate conductor comprising conducting material selected from the following set of conducting material consisting of: doped polycrystalline, amorphous silicon, germanium, silicon germanium, tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), Ti$_3$Al, ZrAl, TaC, TaMgC, carbon nanotube, conductive carbon, graphene, or any combination thereof.

17. The semiconductor FET structure of claim 1, wherein the source/drain region layer including disposed directly thereon a plurality of fins of a plurality of FinFETs.

18. The semiconductor FET structure of claim 1, wherein the source/drain region layer includes a plurality of merged source/drain regions of a plurality of FETs.

* * * * *